United States Patent
Ray

[11] Patent Number: 5,160,846
[45] Date of Patent: Nov. 3, 1992

[54] METHOD AND APPARATUS FOR REDUCING TILT ANGLE VARIATIONS IN AN ION IMPLANTER

[75] Inventor: Andrew M. Ray, Austin, Tex.

[73] Assignee: Eaton Corporation, Cleveland, Ohio

[21] Appl. No.: 804,484

[22] Filed: Dec. 9, 1991

Related U.S. Application Data

[63] Continuation of Ser. No. 592,363, Oct. 3, 1990, abandoned.

[51] Int. Cl.[5] .......................................... H01J 37/317
[52] U.S. Cl. ................................. 250/492.2; 250/398
[58] Field of Search ............... 250/396 R, 398, 492.21

[56] References Cited

U.S. PATENT DOCUMENTS

| 4,276,477 | 6/1981 | Enge | 250/398 |
|---|---|---|---|
| 4,661,709 | 4/1987 | Walker | 250/398 |
| 4,661,712 | 4/1987 | Mobley | 250/492.2 |
| 4,687,936 | 8/1987 | McIntyre et al. | 250/397 |
| 4,794,305 | 12/1988 | Matsukawa | 250/442.1 |
| 4,922,106 | 5/1990 | Berrian et al. | 250/492.2 |
| 4,929,840 | 5/1990 | Dykstra et al. | 250/398 |
| 4,942,342 | 7/1990 | Tsukakoshi | 315/410 |
| 4,994,336 | 2/1991 | Benecke et al. | 430/5 |
| 5,003,183 | 3/1991 | Nogami et al. | 250/398 |
| 5,012,105 | 4/1991 | Ando et al. | 250/398 |
| 5,091,655 | 2/1992 | Dykstra et al. | 250/398 |

FOREIGN PATENT DOCUMENTS 132552 2/1985 European Pat. Off.

*Primary Examiner*—Bruce C. Anderson
*Attorney, Agent, or Firm*—Watts, Hoffmann, Fisher & Heinke

[57] ABSTRACT

An ion beam implantation system. An ion beam is controllably deflected from an initial trajectory as it passes through spaced parallel that are biased by a control circuit. Once deflected, the ion beam enters an electrostatic lens that redeflects the once deflected ion beam. When the beam exits the lens it moves along a trajectory that impacts a workpiece. By controlled deflection of the beam multiple parallel beam paths result, all of which input the workpiece at a uniform impact angle.

11 Claims, 4 Drawing Sheets

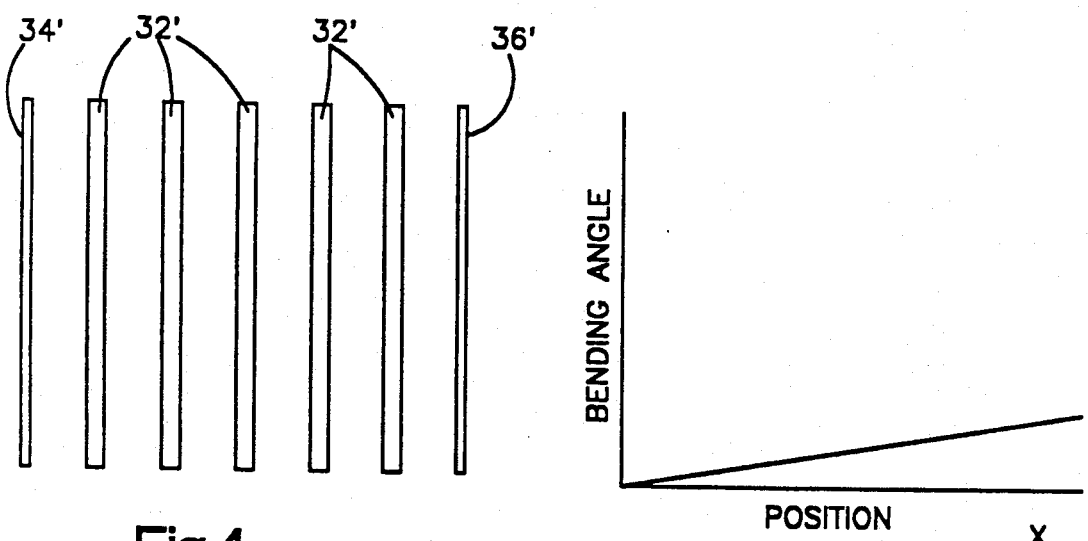
Fig.4
Fig.8
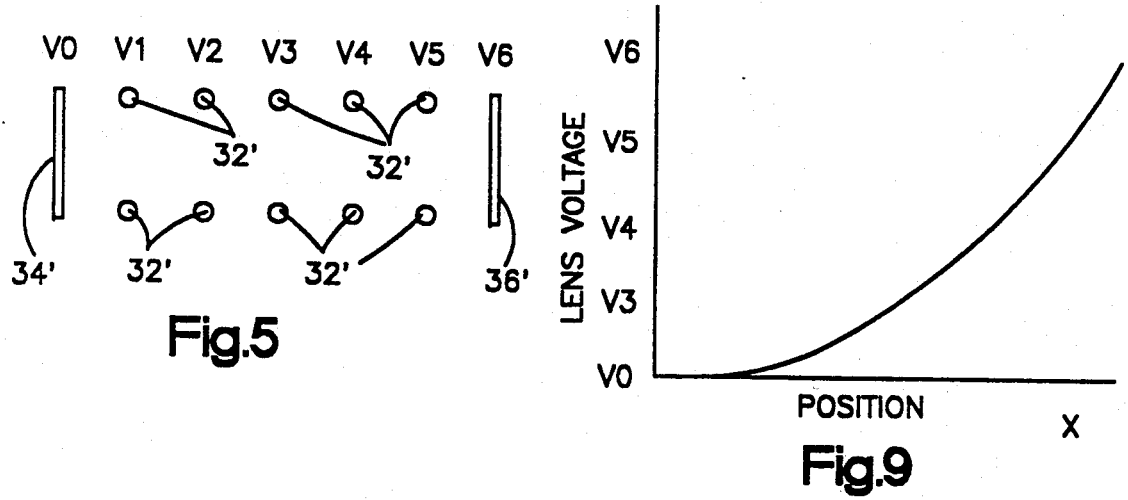
Fig.5
Fig.9
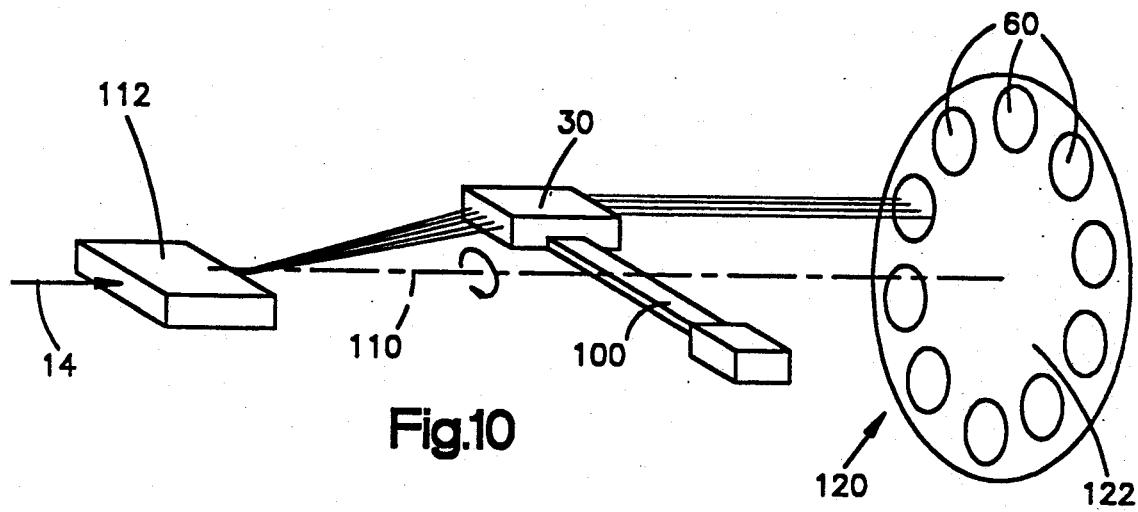
Fig.10

METHOD AND APPARATUS FOR REDUCING TILT ANGLE VARIATIONS IN AN ION IMPLANTER

This is a continuation of copending application Ser. No. 07/592,363 filed on Oct. 3, 1990 now abandoned.

FIELD OF THE INVENTION

The present invention concerns an ion implanter for treating workpieces and has a particular application in ion implanting semiconductor wafers.

BACKGROUND ART

It is known in the semiconductor fabrication art to use an ion beam to dope semiconductor wafers with ion impurities. By scanning a beam across a wafer surface or moving the wafer through a stationary beam the wafer can be uniformly doped.

The angle at which an ion beam impacts a wafer surface (wafer tilt) is an important parameter in ion implantation of the wafer. Recent trends in semiconductor material processing require a decreased ion impact angle variation across the wafer surface.

In a scanning ion beam system, electrostatic deflection plates produce a raster pattern of ion beam impingement on the wafer surface. One set of plates produces a rapid back and forth scan in one direction and a second set of plates provides beam deflection in an orthogonal direction. Such raster scanning results in impact angle variations of ±4° across a 200 mm wafer for a typical ion beam geometry.

Methods have been proposed to reduce this impact angle variation. One proposal suggests using four sets of deflection plates, two horizontal and two vertical, and is referred to as a double deflection system. The beam is first deflected away from an initial trajectory and then, just before striking the wafer, is deflected again to return to a direction parallel to its original, undeflected trajectory.

Use of a double deflection system with large wafer diameters requires deflection plates that are more widely spaced. This requires high deflection voltages that must be scanned and precisely synchronized with the scanning voltages applied to the first set of deflection plates. Another problem is that as the opening in the scan plates increases, electrostatic fringing fields become more difficult to control and become more susceptible to beam space charge effects.

Another known method of reducing tilt variations is to use a mechanically scanned, spinning disk wafer support. If the spin axis is parallel to the beam, no impact angle variations are present. Spinning disk supports have problems achieving control over impact angle while maintaining the necessary condition for an impact angle variation. One example of a prior art patent having a spinning workpiece support is U.S. Pat. No. 4,794,305 to Matsukawa.

Another more recent approach is to electrostatically scan the beam in one axis, and then use a highly indexed bending magnet to produce a parallel ribbon beam. The wafer is then scanned mechanically in a direction orthogonal to the ribbon beam to produce a uniform two dimensional implant. U.S. Pat. Nos. 4,276,477 to Enge, 4,687,936 to McIntyre et al. and 4,922,106 to Berrian et al. disclose such systems.

DISCLOSURE OF THE INVENTION

The present invention concerns method and apparatus for achieving a uniform angle of impact between an ion beam and a workpiece such as a semiconductor wafer. The invention includes a means for deflecting the ion beam by a controlled amount and then directing the ion beam through a lens that redeflects the beam a variable amount depending upon the trajectory at which the beam enters the lens.

An ion beam implant system constructed in accordance with the present invention includes a source for providing ions to treat a workpiece and a support for orienting the workpiece at a location relative the source. Beam forming apparatus shapes the ion beam as it exits the source to cause the ions to move along a first trajectory.

A deflection electrode deflects the ion beam away from its initial trajectory by a controlled amount and directs the ion beam to an electrostatic lens that again bends the ion beam to impact the workpiece at a uniform controlled impact angle. A control circuit that is coupled to the deflection electrode causes the ion beam to be deflected by the controlled amount. The electrostatic lens has a plurality of lens electrodes arranged in spaced relation to the ion beam travel path biased to specified control voltages. The resultant electric field created by the voltage of the lens electrodes bends the ion beam by an amount dependent upon the travel path of the ion beam through the electrostatic lens as well as the mass and energy of the ions.

The operation of the lens is analogous to the operation of an optical lens since the amount of deflection the ion beam experiences varies with the angle and position at which the ion beam enters the electric fields generated by the lens.

In accordance with a preferred embodiment of the invention, the controlled initial deflection and redirection due to operation of a the electrostatic lens is accomplished in one dimension. Two-dimensional scanning of a workpiece is accomplished by relative movement of the scanning structure in relation to the workpiece. This can be accomplished by either movement of the workpiece or movement of the beam deflecting structure. An alternative to the preferred and disclosed design uses a circular scanning motion wherein the deflecting or scanning electrode as well as the electrostatic lens structure is rotated at a controlled rate as the deflected ion beam impacts a circular array of stationary wafers.

Other objects, advantages and features of the invention will become better understood from a detailed description of the preferred embodiment of the invention which is described in conjunction with the accompanying drawings.

BRIEF DESCRIPTION OF THE DRAWINGS

FIG. 4 is a plan view of an alternate embodiment of an electrostatic lens structure constructed in accordance with the invention;

FIG. 5 is an elevation view of the FIG. 4 electrostatic lens;

FIG. 8 is a graph of bending angle vs. position for the FIG. 4 electrostatic lens;

FIG. 9 is a graph of electrode voltage vs. position for the FIG. 4 electrostatic lens;

FIG. 10 is a schematic showing a circular scanning ion beam implanter for implanting a plurality of workpieces.

BEST MODE FOR CARRYING OUT THE INVENTION

Figure 1:
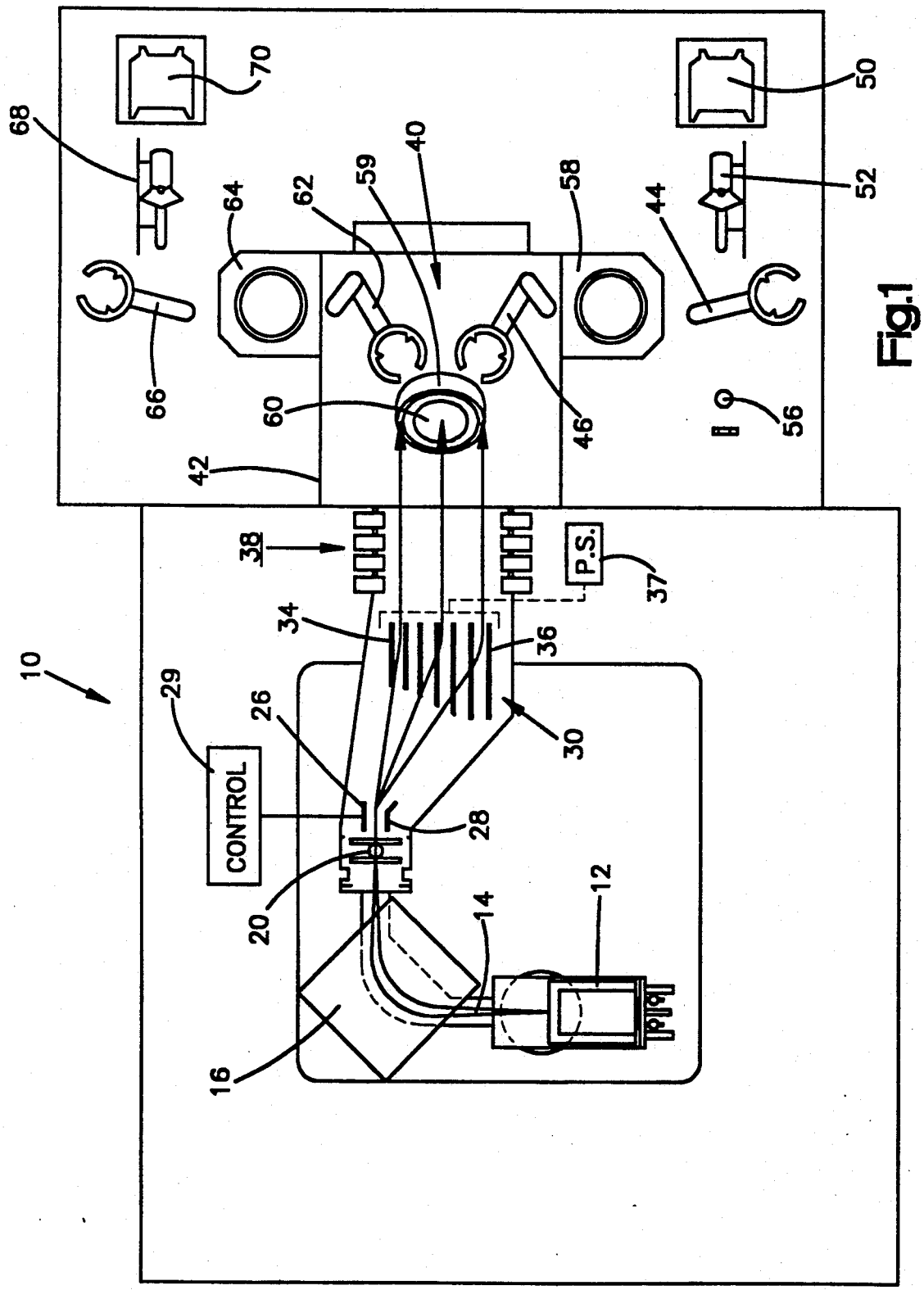
FIG. 1 is a schematic of an ion implantation system constructed in accordance with the invention.

Turning now to the drawings, an ion implantation system 10 is illustrated having an ion source 12 for directing an ion beam 14 along a trajectory leading to an ion mass analyzing magnet 16. The magnet 16 bends the beam at approximately a right angle and directs ions having an appropriate mass along a travel path through a resolving aperture 20. The shutter 20 rejects ions having an inappropriate mass from the ion beam.

Figure 2:
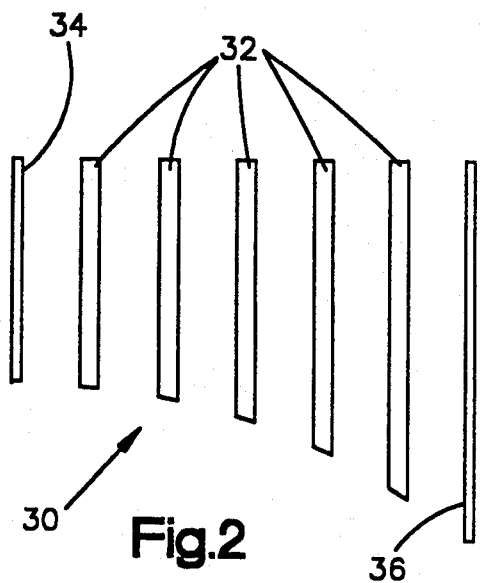
FIG. 2 is a plan view of an electrostatic lens structure for deflecting an ion beam as it passes to the region of a workpiece.

The beam 14 then passes through a pair of deflection electrodes 26, 28. Control voltages applied to the electrodes 26, 28 by a control circuit 29 cause the ion beam to pass through electric fields which deflect the ion beam 14 by a controlled amount. The magnitude of the voltage difference between the two plates 26, 28 controls the amount of deflection. The deflected ion beam enters an electrostatic lens 30 where it is redirected along a travel path generally parallel to the trajectory the beam follows as it exits the analyzing magnet 16. The electrostatic lens 30 includes a number of individual electrodes 32 and a pair of spaced parallel plates 34, 36 (FIG. 2). After passing through the lens 30 the ions in the beam are optionally accelerated to a final implantation energy by an electrostatic accelerator 38.

Downstream from the electrostatic lens 30, an ion implantation station 40 includes structure that supports a semiconductor wafer at a postion to intercept ions that have been accelerated by the accelerator 38. Ion beam collisions with other particles degrade beam integrity so that the entire beam line from the source 12 to the implantation station 40 is evacuated. At the region of the ion implantation station 40 a chamber 42 is evacuated and the wafers are inserted into and withdrawn from load locks to avoid repeated pressurization and depressurization of the chamber 42. A mechanized arm 44 grasps wafers retrieved from a cassette 50 by a shuttle 52 and positions each undoped wafer on a wafer orienter 56. The orienter 56 rotates the undoped wafer to a particular orientation before ion implantation so that as ions strike the wafer they encounter a specific orientation of the crystal lattice structure. The wafer is then moved into a load lock 58 so that a second arm 46 can move the wafers to an implant position within the chamber 42. At the implantation site a wafer support 59 orients the wafer 60 with respect to the ion beam at a specific tilt angle that remains constant due to the parallel ion beam orientation.

The scanning electrodes 26, 28 produce side-to-side beam scanning of a controlled amount under the direction of the control circuitry 29. The circuitry includes a programmable controller for adjusting the scanning electrode voltages to achieve this wafer scanning. The particular system depicted in FIG. 1 produces only side-to-side scanning so that to fully implant a workpiece such as the circular wafers depicted in FIG. 1, an additional relative motion between the deflected ion beam and the workpiece is necessary. In this implementation, a linear back and forth scan of a wafer 60 at the ion implantation station 40 is achieved through suitable drive mechanisms (not shown) for the support 59.

Once the wafer 60 has been doped by treatment with the ion beam, the now-doped wafer is removed from the implanation station 40 by a third arm 62. This arm 62 delivers the wafer 60 to a load lock 64 so that a fourth mechanized arm 66 can transfer the wafer to a shuttle 68 that stores the doped wafer in a cassette 70.

Figure 6:
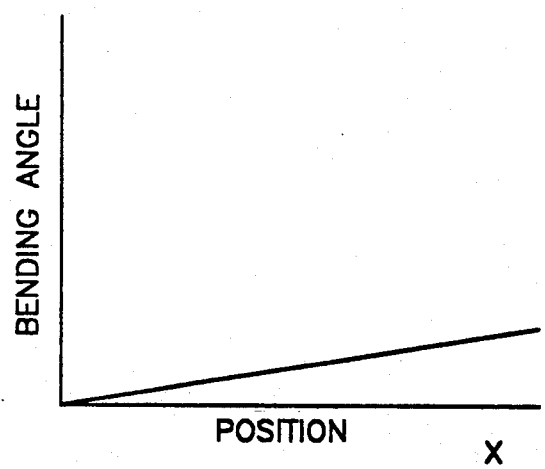
FIG. 6 is a graph of bending angle vs. position for the lens structure of FIG. 2.
Figure 3:
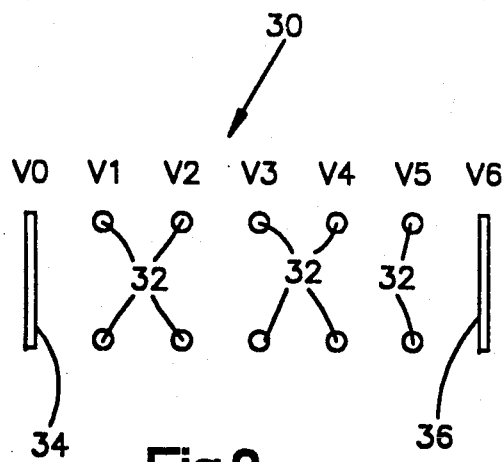
FIG. 3 is an elevation view of the FIG. 2 electrostatic lens.
Figure 7:
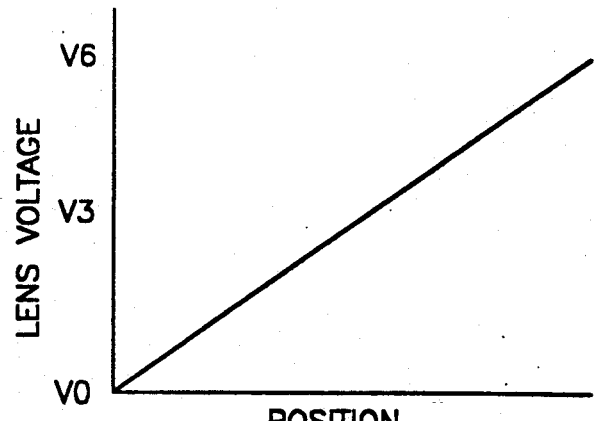
FIG. 7 is a graph of electrode voltage vs. position for the lens structure of FIG. 2.

FIGS. 2 and 3 illustrate one of two disclosed lens configurations. Individual ions from the beam 14 are deflected by the voltage of the two metal plates 26, 28 and pass through a region bounded by the two plates 34, 36 and a plurality of metal electrodes 32. The spacing between the two plates 34, 36 define the width of the electrostatic lens 30. As depicted in the graph of FIG. 7, the plate 34 is maintained at a constant electric potential less than the potential on the plate 36 by a power supply 37. In FIGS. 6 and 7 the abscissa "x" designates a distance from the plate 34. The voltages on the electrodes 32 depend upon the relative positioning of those electrodes with respect to the two plates 34, 36. The electrode voltages increase from the plate 34 to the plate 36.

Generally, the voltage on the electrodes is chosen to vary linearly with the position between the two plates 34, 36 and is maintained by a suitably constructed direct current power supply capable of providing a voltage difference between the plates 34, 36 of hundreds of volts.

As seen in FIG. 2, the plate 34 is shorter than the plate 36 and the electrode length also varies. The dimensions of the electrodes and plates and the choice of biasing voltages applied to the electrodes and plates produce a bending angle depicted in FIG. 6. Those ions that are deflected the greatest amount by the plates 26, 28 are redeflected a greater amount due to longer electrostatic interaction with the electric fields created within the lens.

The position at which ions enter the region between the two plates 34, 36 varies with the initial deflection angle. Due to the compensating effect of the lens 30 a proportional redeflection occurs and all ions entering the lens exit along parallel paths. By controlled side to side beam deflection a narrow uniform ion beam that traverses the entire width of the wafer 60 is provided.

FIGS. 4 and 5 depict an alternate arrangement for an electrostatic lens 30'. In this arrangement, both plates 34', 36' and all electrodes 32' have the same length. The electrodes and plates are held at a constant voltage but as seen in FIG. 9, the voltage variation between the two plates is nonlinear. The net result is a bending angle which is linear with respect to position (see FIG. 8).

Figure 11:
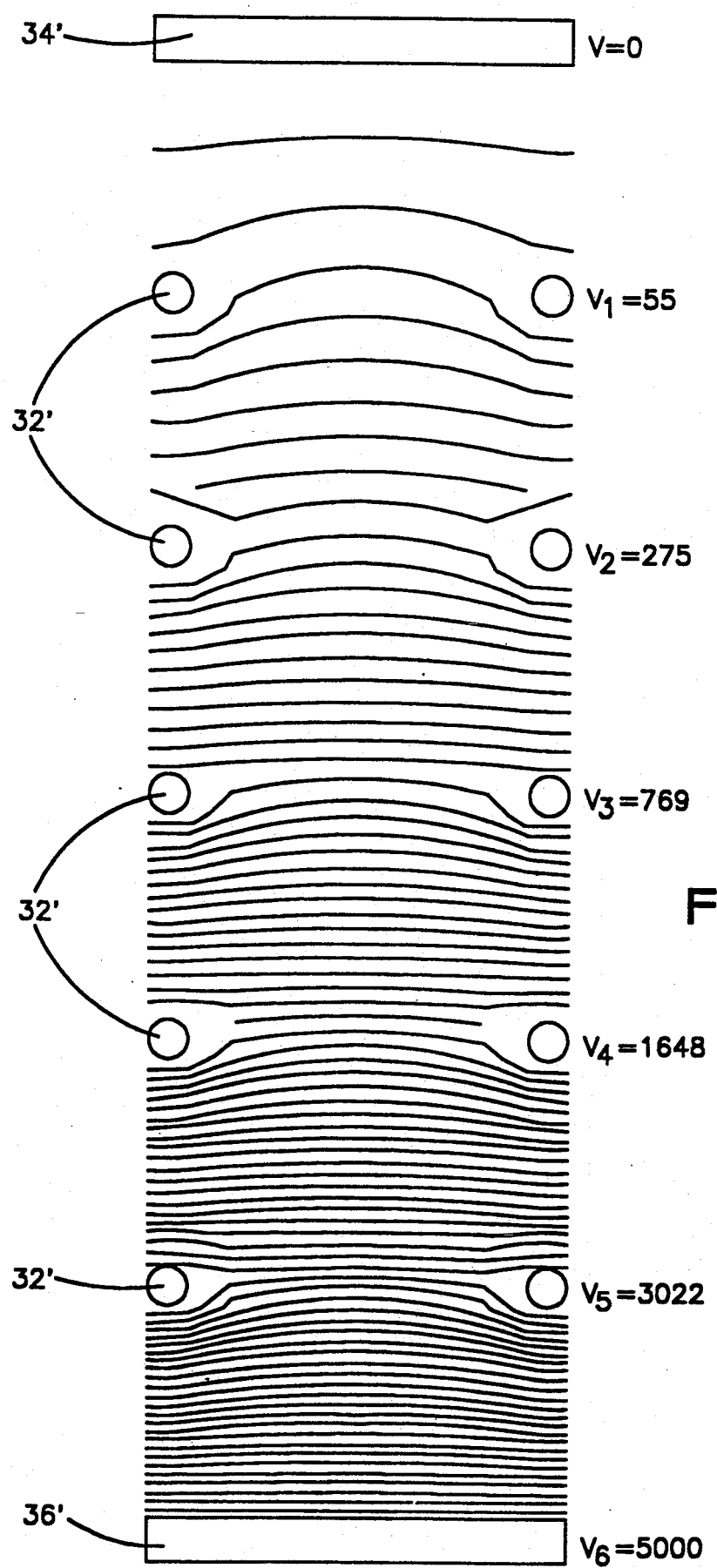
FIG. 11 is an enlarged view of the FIG. 5 depiction showing electric field lines created due to application of control voltages to the electrodes of the electrostatic lens.

The curve depicted in FIG. 9 is of the form $V_n \alpha X^m$ where m is approximately two and X is the distance from the electrode 34'. $V_n$ is proportional to the beam energy and the incoming scan angle as well as the dimensions, number and spacing of the electrodes. In FIG. 11 an enlarged view of the FIG. 4 depiction is disclosed to show the electric field lines in the vicinity of the electrodes 32' and end plates 34', 36'.

In the FIG. 11 depiction the lens has a total width of 240 mm with equal spacing between electrodes. The electrode length is approximately 8 inches. The voltage on each electrode is adjusted for each relevant parameter and then fixed for a particular ion implantation. Although the voltages vary for different parameters the ratio of the voltages should conform to the proportionality given above.

It is possible to adjust the value of the exponent m to tune the ion beam's degree of parallelism and to adjust for fringing field effects at the entrance and exit to the lens. Values of m from 1.8 to 2.2 have been used and the resulting voltages are tabulated below in Table 1.

TABLE 1

| Electrode Position (mm) | 0 | 40 | 80 | 120 | 160 | 200 | 240 |
|---|---|---|---|---|---|---|---|
| Voltage $\alpha\ x^2$ | 0 | 55 | 275 | 769 | 1648 | 3022 | 5000 |
| Voltage $\alpha\ x^{1.9}$ | 0 | 60 | 283 | 766 | 1601 | 2875 | 5000 |
| Voltage $\alpha\ x^{2.1}$ | 0 | 62 | 330 | 958 | 2106 | 3940 | 5000 |

As noted above, in the FIG. 1 embodiment of the invention, the wafer is mounted to a support 59 which traverses back and forth through the thin, generally planar ion beam. This avoids the need for a large lens opening with accompanying loss of precise control of the electric field.

FIG. 10 depicts an alternate arrangement in which the electrostatic lens 30 is mounted to a elongated support 100 which rotates about an axis 110 corresponding to an initial beam trajectory. Ions within the beam 14 enter a deflection station 112 that includes a pair of parallel deflection plates mounted for rotation. The ion beam is deflected a variable amount and scanned about the rotation axis 110. Rotation of the scanning electrodes and electrostatic lens is simultaneous and preferably accomplished by a mechanical interconnection of the scanning plates and lens. This allows a single motor to rotate both the deflection plates and the lens 30. As the scanning plates deflect the ion beam, they pass through the electrostatic lens 30 and are redeflected along parallel paths to an ion implantation station 120. At this ion implantation station a wafer support 122 carried a plurality of semiconductor wafers 60.

The wafer support 122 is mounted for movement between a position in which the wafers are placed onto the support and a second position in which the wafers are presented for implantation. The wafers remain stationary as the deflecting plate and electrostatic lens are rotated causing the parallel rays from the ion beam to impact the circularly arranged semiconductor wafers 60.

A slightly different embodiment of the structure depicted in FIG. 10 would include fixed deflection plates and electrostatic lens and a rotating wafer support for causing multiple wafers to pass through the parallel rays of the twice deflected ion beam.

The control electronics 29 coupled to the deflection plates 26, 28 is necessary to assure uniform ion implantation. Such electronics is typically coupled to a programmable controller which automatically applies a variable voltage signal across the two parallel plates causing the angle at which the ion beam is deflected to vary with time. By repeating the scanning voltage variation a cyclic beam deflection is provided causing a uniform ion implantation dosage as relative rotation between the ion beam and wafers is provided.

The invention has been described in conjunction with multiple alternate embodiments. It is the intent that the invention include all modifications and alterations from these embodiments falling within the spirit or scope of the appended claims.

I claim:

1. An ion beam implant system for controllably treating a generally planar workpiece comprising:
    a. source means for providing ions to treat the planar workpiece;
    b. support means for orienting the planar workpiece at a location relative the source means;
    c. beam forming means for causing ions emitted by the source means to form an ion beam moving in a first trajectory;
    d. deflection means for deflecting ions in said ion beam away from said first trajectory by controlled initial deflection amounts along diverging trajectories;
    e. a plurality of electrodes bounding an ion beam travel path for setting up a non-uniform static electric field to intercept and redeflect ions moving along said diverging trajectories to redirect ions to impact trajectories that intercept said generally planar workpiece at a uniform, controlled impact angle;
    f. control means having an output coupled to said deflection means to adjust the deflecting of said ion beam and thereby control treatment of the generally planar workpiece; and
    g. biasing means for maintaining the plurality of electrodes at control voltages for setting up the non-uniform static electric field.

2. The ion implant system of claim 1 wherein said deflection means and said lens means are connected together and further comprising means to rotate said deflection means and lens means about an axis to sweep over a scanned planar workpiece.

3. The ion implant system of claim 1 wherein said deflection means and said lens means are fixed and the support means moves the workpiece relative the ion beam.

4. A method for implanting a generally planar workpiece with an ion beam comprising the steps of:
    a. providing an ion beam having ions that move along a first trajectory;
    b. deflecting ions from the first trajectory by controlled amounts to create a diverging ion beam;
    c. creating a non-uniform static electric field at a region for intercepting the diverging ion beam that redeflects the ions in the diverging ion beam to workpiece impact trajectories that are generally parallel to each other; and
    d. providing relative scanning movement between one or more of the generally planar workpieces and the ion beam subsequent to said region where the ion beam is redeflected.

5. The method of claim 4 wherein said scanning moving is a rotating movement.

6. An electrostatic lens for deflecting ions passing through an ion deflection region on their way to a target comprising:
    a. a plurality of elongated conductive electrodes spaced from each other to define a first row of electrodes bounding one side of said region;
    b. a plurality of elongated conductive electrodes spaced from each other to define a second row of electrodes bounding a second side of said region;
    c. first and second conductive plates spanning a gap between said first and second rows of electrodes which combine with said first and second rows of electrodes to define the ion deflection region through which ions pass and are deflected before striking the target; and d. biasing means for applying voltages to the electrodes of the first and second rows and the first and second conductive plates to produce an electric field within the deflection region.

7. The electrostatic lens of claim 6 where the biasing means applies voltages to the electrodes and side wall defining members to create an electric field tending to cause the ions to exit the deflection region with approximately parallel trajectories.

8. An ion beam implant system for controllably treating a workpiece comprising:

a. source means for providing ions to treat the workpiece;

b. support means for orienting the workpiece at a location relative the source means;

c. beam forming means for causing ions emitted by the source means to form an ion beam moving in a first trajectory;

d. deflection means for deflecting ions in said ion beam away from said first trajectory by a controlled amount;

e. lens means for further deflecting ions deflected by said controlled amounts to impact said workpiece at a uniform controlled impact angle; and f. control means having an output coupled to said deflection means to adjust the deflecting of said ion beam and thereby control treatment of the workpiece;

g. said lens means comprising a pair of opposed parallel plates for creating a primary electric field between said opposed parallel plates and two substantially parallel rows of electrodes spaced from the ion beam travel path for modifying the electric field between the opposed parallel plates and biasing means for biasing the plurality of scan electrodes at adjustable control voltages.

9. The ion implant system of claim 8 wherein said deflection means and said lens means are connected together and further comprising means to rotate said deflection means and lens means about an axis to sweep over a scanned target.

10. The ion implant system of claim 8 wherein said deflection means and said lens means are fixed and the support means moves the workpiece relative the ion beam.

11. The ion beam implant system of claim 8 wherein the parallel plates are of unequal lengths and wherein electrodes within the rows of electrodes increase in length from a shorter to a longer plate along the extent of said parallel rows.

* * * * *